United States Patent [19]
Bortolini et al.

[11] Patent Number: 5,268,635
[45] Date of Patent: Dec. 7, 1993

[54] INTELLIGENT SELF-DIAGNOSING AND SPARING LIGHT EMITTING DIODES

[75] Inventors: James R. Bortolini, Boulder; Gary J. Grimes, Thornton, both of Colo.

[73] Assignee: AT&T Bell Laboratories, Murray Hill, N.J.

[21] Appl. No.: 922,895

[22] Filed: Jul. 31, 1992

[51] Int. Cl.⁵ .......................................... G01R 31/308
[52] U.S. Cl. ................. 324/96; 324/158 R; 340/642
[58] Field of Search ............ 340/642, 514, 534; 373/96; 324/158 D, 158 P, 158 R; 362/800 D

[56] References Cited

FOREIGN PATENT DOCUMENTS 0014079 2/1979 Japan ................................ 340/642
0126967 7/1984 Japan ................................ 324/158

Primary Examiner—Kenneth A. Wieder
Assistant Examiner—Barry C. Bowser
Attorney, Agent, or Firm—John C. Moran

[57] ABSTRACT

Visual indication of an operational condition on a printed circuit board by utilizing a pair of LEDs for each operational indication and by utilizing each LED of a pair to verify that the other LED can emit light greater than a predefined level. In addition, if an error condition is determined to exist in a pair of LEDs, a central processor is notified of this fact to allow the error condition to be remedied. Further, if a failure is detected in the pair, both LEDs are utilized to indicate an operational condition on the printed circuit board. This increases the probability that the LED pair will be able to indicate the operational condition.

8 Claims, 3 Drawing Sheets

INTELLIGENT SELF-DIAGNOSING AND SPARING LIGHT EMITTING DIODES

TECHNICAL FIELD

This invention relates to the utilization and testing of an apparatus that combines light emitting diodes (LEDs) and control circuitry to enchance reliability. LEDs are used extensively to indicate fault and other operating conditions on printed circuit boards and other electrical assemblies. The utilization of LEDs in this manner allows field service personnel to rapidly identify a printed circuit board that has failed or that it is in a particular operating state. One problem with the utilization of LEDs on printed circuit boards is that of testing the LEDs in a factory. First, all of the LEDs on a printed circuit board have to be turned on, and second, a human has to verify that the LEDs are on. This creates another step in factory testing and does not allow for fully automated printed circuit board testing. The second problem arises in trying to verify that the LEDs are functioning properly in the field. There is no economical means of verifying the operations of such LEDs since it is impractical to require field personnel to verify that the LEDs on all printed circuit boards in a system are functioning properly.

Yet, if the LEDs are not functioning properly, it may be difficult or even impossible for field personnel to identify a failing printed circuit board. Nor, is it feasible to merely duplicate every LED since a component in the LED control circuit may fail also.

SUMMARY OF THE INVENTION

The aforementioned problems are solved and a technical advance is achieved in the art by utilizing pairs of LEDs for each operational indication and utilizing each LED of a pair to verify that the other LED can emit light greater than a predefined level. In addition, if an error condition is determined to exist in a pair of LEDs, a central processor is notified of this fact to allow the error condition to be remedied. Further, if a failure is detected in the pair, both LEDs are utilized to indicate an operational condition on a printed circuit board. This increases the probability that at least one LED of the LED pair will be able to indicate the operational condition.

In a second embodiment of the invention, a circuit activates a first LED of a pair in response to an operational condition. Also, in response to the operational condition, the circuit tests the second LED of the pair to determine if the first LED is emitting a predetermined amount of light. The circuit generates an error signal if first LED is not emitting the predetermined amount of light. If the error signal is generated, the circuit activates the second LED to emit light. In order to test the second LED, the circuit first reverse-biases the second LED and determines if the amount of reverse-bias current flowing through the second LED is within a predetermined range which indicates that the first LED is emitting the predetermined amount of light. The circuit activates the second LED to emit light by forward-biasing the second LED.

DETAILED DESCRIPTION

Figure 1:
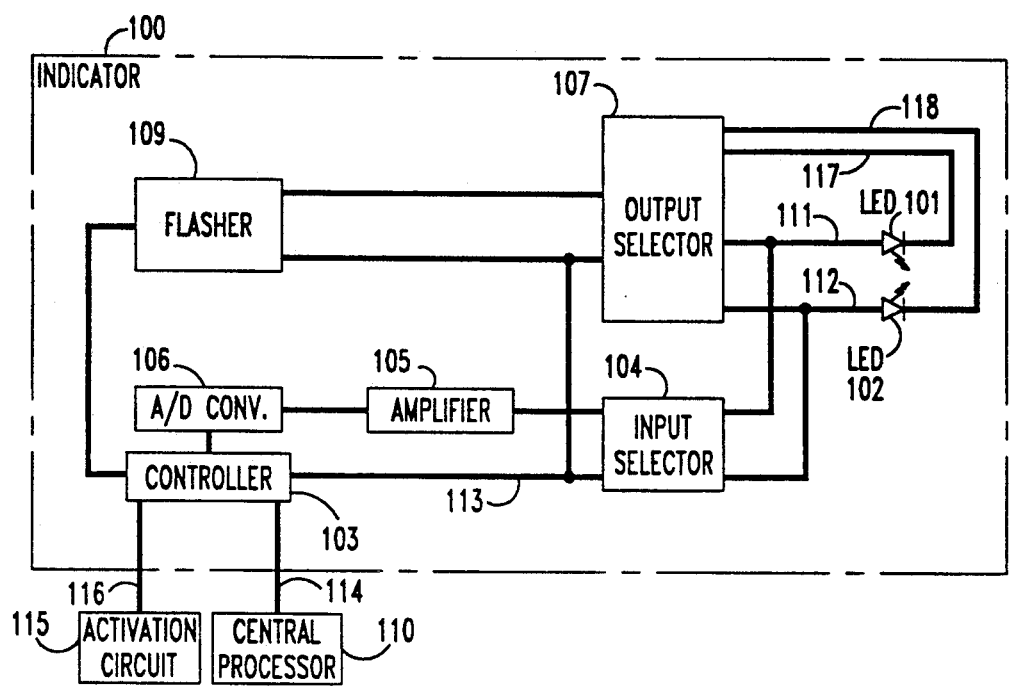
FIG. 1 illustrates, in block diagram form, a circuit in accordance with the invention.

FIG. 1 illustrates indicator 100 which implements the invention. Controller 103 controls the operations of indicator 100. Controller 103 is responsive to a signal from activation circuit 115 indicating that an operational condition has occurred on a printed circuit board to turn on one or both of the LEDs. In addition, controller 103 is periodically checking to assure that the LEDs can emit and detect light. If controller 103 determines that there is a failure of one or both LEDs, controller 103 transmits a signal to central processor 110. Indicator 100 utilizes the well known fact that an LED can both emit light and detect light. To test whether the LEDs can emit light greater than a predefined level, controller 103 first turns on LED 101 via flasher 109 and output selector 107 via cable 113. Controller 103 then tests to see whether LED 102 is detecting light from LED 101 by using input selector 104, amplifier 105, and A-to-D converter 106. If the test is successful, controller 103 then tests whether LED 102 can emit light in a similar fashion. If a failure is detected during the testing of either LED 101 or 102, controller 103 transmits an error signal to central processor 110 via conductor 114. Because of the typical operating speeds of LEDs 101 and 102, input selector 104, and output selector 107, testing can be accomplished without being visually apparent.

For an LED to emit light, it must be forward biased; but for an LED to detect light it must be reversed biased. When an LED is detecting light, the reverse bias current flowing through that LED indicates the amount of light being detected. Output selector 107 applies the required bias to LED 101 via conductor 111 and 117 and to LED 102 via conductors 112 and 118. In one exemplary embodiment, output selector 107 supplies current to a LED in the light emitting state by means of a reversible voltage source which is current limited by means of a resistor in the path attached to the anode of the LED. When the reversible voltage source is reversed by means of a relay or other circuitry to put the LED in the sense state, the current limit resistor can serve as a sensing resistor to determine the reverse bias current.

Controller 103 is responsive to a signal from activation circuit 115 to turn on LED 101 by utilizing output selector 107 and flasher 109, if no error was detected during the testing of the LEDs. If an error was detected during the testing of the LEDs, controller 103 is responsive to a signal from activation circuit 115 to attempt to turn on both LED 101 and LED 102 by properly controlling output selector 107. Elements 104 through 109 are well known to those skilled in the art. In addition, using well known techniques, controller 103 could control a plurality of LEDs utilizing elements 104 through 109.

Figure 2:
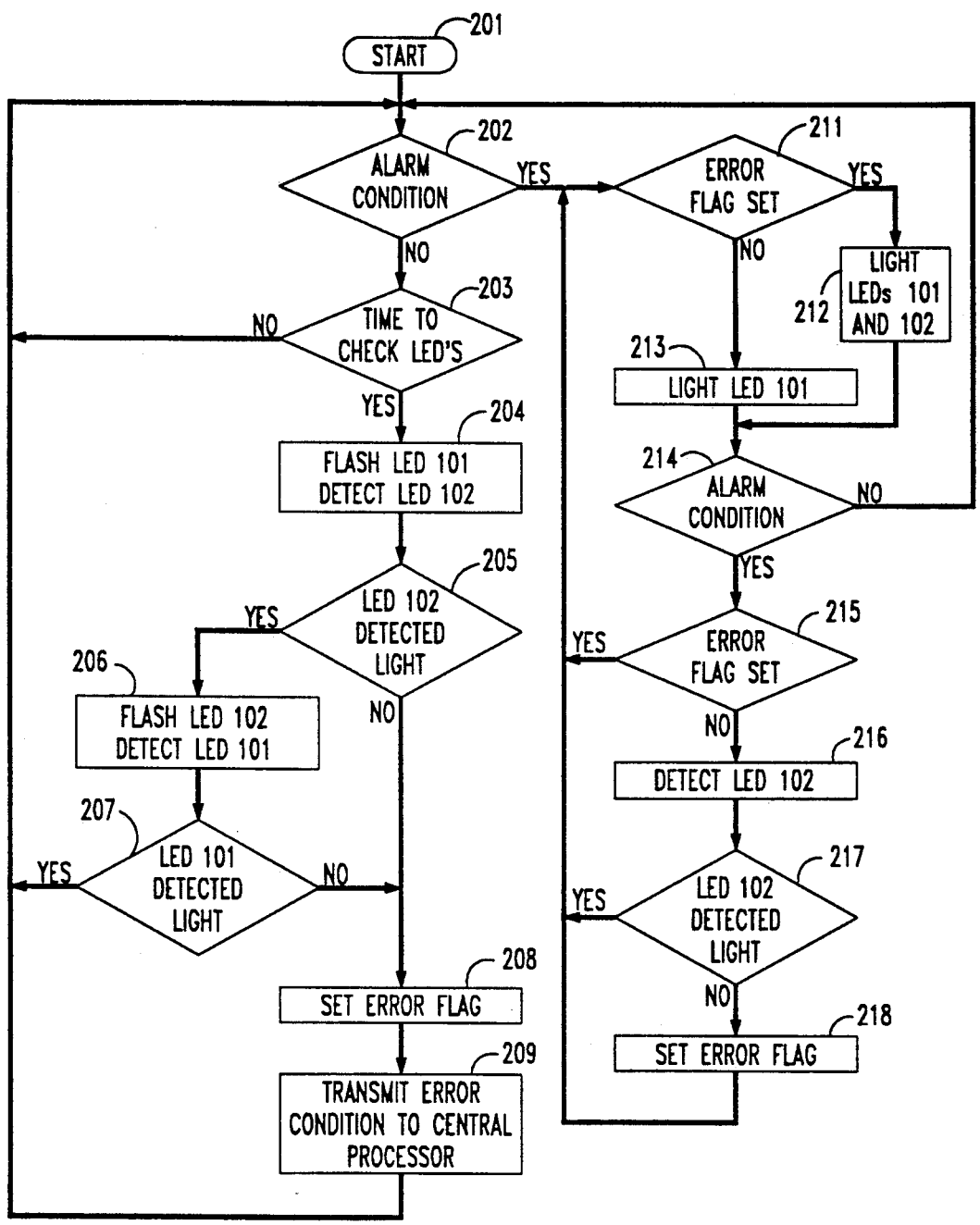
FIG. 2 illustrates, in flowchart form, the operations of a controller.

Controller 103 can be implemented using either a microprocessor or wired logic. FIG. 2 shows a flowchart of the operations performed by controller 103. Upon being reset, controller 103 starts at block 201. Block 202 tests for whether an operational condition has been detected by activation circuit 115 on the printed circuit board. If the answer is no, control is passed to decision block 203 which checks to see whether the time has elapsed for the periodic checking of the LEDs. If it is time to check the LEDs, block 204 is executed which flashes LED 101 and detects whether or not light greater than the predefined level was detected by LED 102. Decision block 205 determines whether or not light was detected by LED 102. If light was detected, control is passed to 206 which flashes LED 102 and tests to see whether LED 101 detected light greater than the predefined level. Decision block 207 determines whether LED 101 detected light greater than the predefined level. If the answer is yes, control is returned to decision block 202. If the answer was no, control is transferred to block 208 which sets an internal error flag within controller 103. In addition, block 209 transmits an error condition signal to central processor 110. Returning to decision block 205. If LED 102 did not detect light from LED 101, control is transferred to block 208. The operation of blocks 208 and 209 has been described.

Returning to decision block 202, if an operation condition has been detected by activation circuit 115, control is transferred to decision block 211. The latter decision block determines whether the internal error flag has been set. If the flag has been set, control is transferred to block 212 which causes output selector 107 to attempt to turn on both LED 101 and 102 since it is assumed that one of the LEDs is not functioning properly. If the error flag was not set, control is passed to block 213 which turns on LED 101.

Decision block 214 then checks to make sure that the alarm condition still exits; and if the alarm condition no longer exists, control is transferred back to decision block 202. Assuming that the alarm condition still exists, control is passed to decision block 215. Decision block 215 checks to see whether the error flag is set. If the error flag has not been set, then controller 103 verifies that LED 102 is detecting light from LED 101 by execution blocks 216 and 217. If LED 102 is not detecting light, the error flag is set by execution of block 218 and control is returned to decision block 211.

Figure 3:
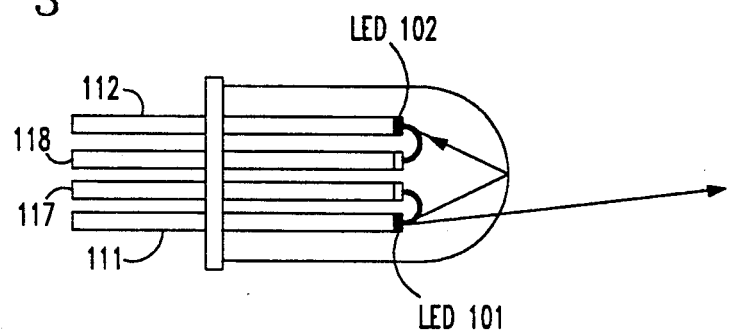
FIGS. 3 and 4 indicate physical arrangements of a pair of LEDs in accordance with the invention.
Figure 4:
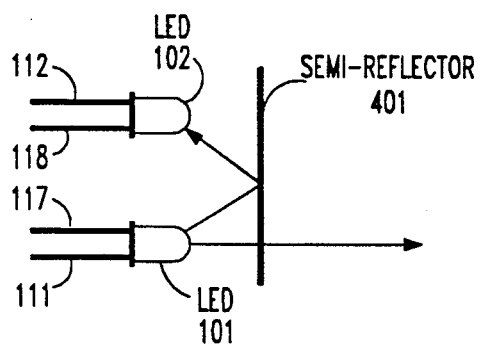

FIG. 3 illustrates a physical implementation of LEDs 101 and 102. The light emitting diodes are physically mounted within a common physical package. Each LED is mounted on a physical post and is wire bonded to an adjacent physical post. The LED which is used as a detector operates from the light reflected off the surface of the package by the LED that is under test due to an refractive index mismatch between the lens of the package and the surrounding air and Raleigh scattering. FIG. 4 illustrates a physical implementation of the LED pair which utilizes the LED each mounted in its own physical package but the semi-reflector 401 is utilized to return some of the light from the LED under test back to the LED being utilized as a detector.

Figure 5:
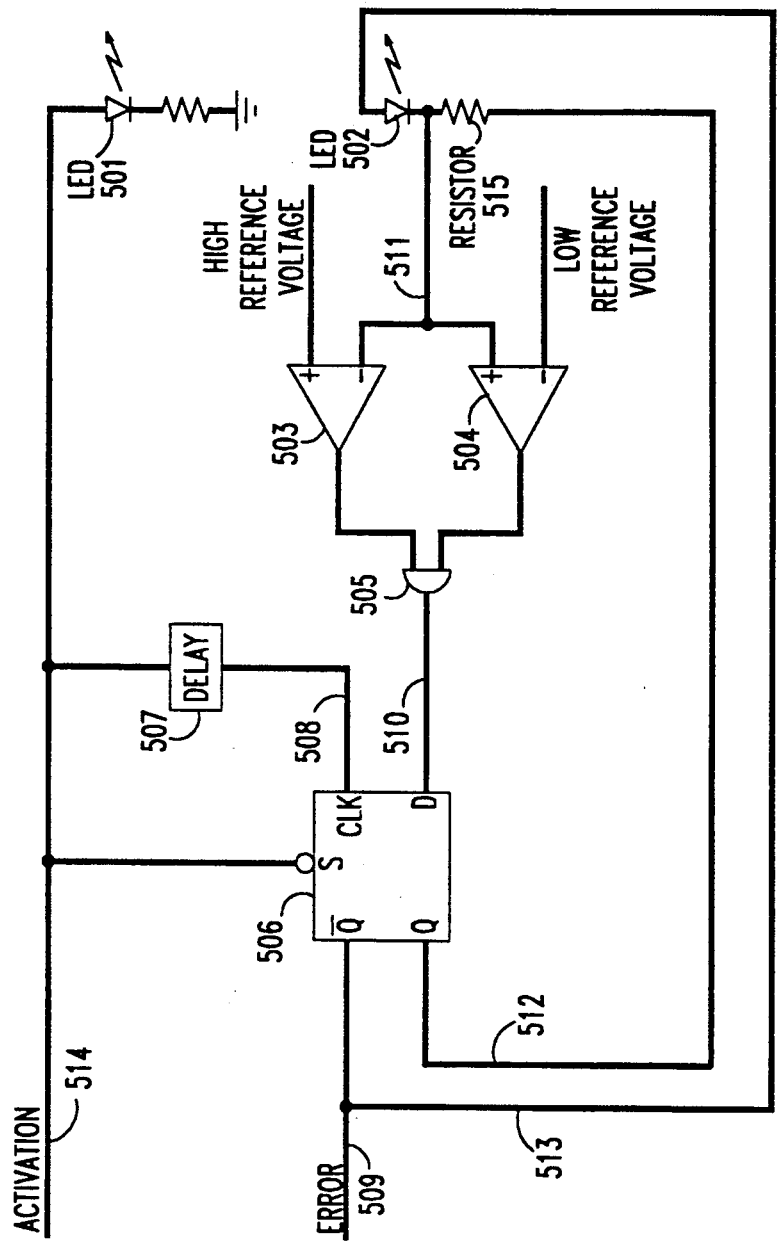
FIG. 5 illustrates a second embodiment of the invention.

FIG. 5 illustrates a second embodiment of the invention. The circuit illustrated in FIG. 5 does not automatically provide for the periodic testing of an LED failure, but, rather, only tests the LED (LED 501) used for operational indication when an activation signal is received via conductor 514. LED 502 is used to detect whether LED 501 is emitting light at a predefined level. LED 501 is directly controlled by the activation signal on conductor 514. If an error condition is detected (e.g., LED 502 does not detect the predefined level of light) logic elements 503 through 507 bias LED 502 such that LED 502 should emit light (LED 502 is forward biased). LEDs 501 and 502 may be physically packaged as illustrated in FIGS. 3 and 4.

Before reception of an activation signal, flip-flop 506 is in the set state for the following reasons. The preset (PS) input of flip-flop 506 is directly connected to conductor 514. Since the activation signal is true at a high voltage ("1") and false at a low voltage ("0"), flip-flop 506 is set via the PS input before the transmission of the activation signal. When the activation signal is received via conductor 514, LED 501 is forward biased and should emit light.

Since LED 502 is directly controlled by the Q output of flip-flop 506 via conductor 512 and the complement of the Q output of flip-flop 506 via conductor 513, LED 502 is in the reversed biased state, when flip-flop 506 is in the set state. The voltage across resistor 515 indicates the amount of light being emitted by LED 501, and voltage comparators 503 and 504 continuously verify that the voltage across resistor 515 is within the voltage range as defined by the high and low reference voltages. If the voltage across resistor 515 is within the specified voltage range, both amplifiers transmit a high voltage ("1") to AND gate 505 which in turn transmits a "1" to the D input of flip-flop 506 via conductor 510. The clock input of flip-flop 506 is controlled by delay element 507 via conductor 508 being responsive to the activation signal. When the activation signal is received, a high voltage ("1"), delay circuit 507 delays the activation signal from being transferred to the clock input of flip-flop 506 until a predefined time period has elapsed. This period of time is sufficient to allow the light emitted by LED 501 to be detected by LED 502 and to allow the voltage across resistor 515 to be converted by elements 503 through 504 to a signal which is transmitted to the D input of flip-flop 506. If LED 501 is emitting light, LED 502 in conjunction with elements 503 through 505 transmits a "1" to the D input of flip-flop 506. This "1" is clocked into flip-flop 506 by the delayed activation signal from delay 507 resulting in flip-flop 506 remaining in the set condition. The result is that the error signal transmitted on conductor 509 is a low voltage and that LED 502 remains in the reversed biased or off condition.

However, if LED 502 does not detect light from LED 501 or LED 502 fails, the voltage sensed by either voltage comparator 503 or 504 is outside of the specified voltage range causing the output of AND gate 505 to have a "0" (low voltage). (If LED 502 fails in the short circuit mode, the voltage across resistor 515 will exceed the high reference voltage.) The "0" from AND gate 505 is clocked into flip-flop 506 causing a low voltage to be transmitted on conductor 512 and a high voltage to be conducted on conductor 513 to LED 502 resulting in LED 502 being forward biased and emitting light unless LED 502 has failed. In addition, the error signal is transmitted on conductor 509 as a high voltage. Under certain conditions, one skilled in the art could readily see that buffer circuits may be required between flip-flop 506 and the connections to LED 502.

It is to be understood that the above-described embodiments are merely illustrative of the principles of the invention and that other arrangements may be devised by those skilled in the art without departing from the spirit and scope of the invention. In particular, one skilled in the art could readily envision that central processor 110 could control activation circuit to perform periodic testing of the indicator circuit of FIG. 5.

We claim:

1. A visual indicator for displaying an operational condition in a circuit in response to a signal from said circuit, comprising:

a first and second light emitting device;

means for controlling said first and second light emitting devices;

said controlling means responsive to the lapse of predetermined amount of time for activating said first light emitting device to emit light and for testing that a predetermined amount of light is emitted by using said second light emitting device as a light detector;

said controlling means further responsive to the lapse of said predetermined amount of time for activating said second light emitting device to emit light and for testing that said predetermined amount of light is emitted by using said first light emitting device as a light detector; and said controlling means responsive to said signal from said circuit and said testing indicating that said first or said second light emitting device failed to emit said predetermined amount of light for activating both said first and second light emitting devices.

2. The visual indicator of claim 1 is interconnected to a system controller and said controlling means responsive to said first or second light emitting device failing to emit said predetermined amount of light during testing for transmitting a error signal to said system controller.

3. The visual indicator of claim 2 wherein said first and second light emitting devices are placed in the same physical package.

4. A visual indicator for displaying an operational condition in a circuit in response to a condition signal from said circuit, comprising:

a first and second light emitting device;

means for activating said first light emitting device in response to said condition signal;

means for testing said second light emitting device in response to said condition signal to determine that said first light emitting device is emitting a predetermined amount of light and for generating an error signal upon said first light emitting device not emitting said predetermined amount of light; and means responsive to said error signal for activating said second light emitting device to emit light.

5. The visual indicator of claim 4 wherein said first and second light emitting devices are placed in the same physical package.

6. The visual indicator of claim 4 wherein said testing means comprises means for reverse-biasing said second light emitting device; and means for detecting that reverse-bias current flowing through said second light emitting device is within a predetermined range thereby indicating that said first light emitting device is emitting said predetermined amount of light.

7. The visual indicator of claim 6 wherein said means for activating said second light emitting device comprises means for forward-biasing said second light emitting device.

8. The visual indicator of claim 7 interconnected to a system controller and said testing means comprises means for transmitting said error signal to said system controller.

* * * * *